United States Patent
Hua

(10) Patent No.: US 8,783,910 B2
(45) Date of Patent: Jul. 22, 2014

(54) LED LAMP SYSTEM UTILIZING A HOLLOW LIQUID-COOLED DEVICE

(75) Inventor: Guichao Hua, Zhejiang (CN)

(73) Assignee: Thinklux (Zhejiang) Lighting Technology Co., Ltd., Binjiang District, Hangzhou Zhejiang (CN)

( * ) Notice: Subject to any disclaimer, the term of this patent is extended or adjusted under 35 U.S.C. 154(b) by 594 days.

(21) Appl. No.: 12/703,442

(22) Filed: Feb. 10, 2010

(65) Prior Publication Data

US 2010/0225219 A1    Sep. 9, 2010

(30) Foreign Application Priority Data

Mar. 5, 2009  (CN) .......................... 2009 1 0096452

(51) Int. Cl.
*F21V 29/00* (2006.01)
*F21V 15/01* (2006.01)

(52) U.S. Cl.
CPC ............. *F21V 29/006* (2013.01); *F21V 15/011* (2013.01); *F21V 29/2231* (2013.01); *F21V 29/2293* (2013.01); *F21V 29/248* (2013.01); *F21V 29/30* (2013.01); *Y10S 362/80* (2013.01)
USPC ........................ 362/294; 362/249.02; 362/800

(58) Field of Classification Search
CPC ... F21V 15/011; F21V 19/006; F21V 23/005; F21V 23/006; F21V 29/004; F21V 29/02; F21V 29/2231; F21V 29/2293; F21V 29/24; F21V 29/248; F21V 29/30; F21Y 2101/02
USPC ..................... 362/249.02, 545, 547, 294, 800
See application file for complete search history.

(56) References Cited

U.S. PATENT DOCUMENTS

| | | | |
|---|---|---|---|
| 5,890,794 A * | 4/1999 | Abtahi et al. ................. | 362/294 |
| 6,982,518 B2 | 1/2006 | Chou et al. | |
| 7,699,501 B2 * | 4/2010 | Liu ............................... | 362/294 |

FOREIGN PATENT DOCUMENTS

| | | |
|---|---|---|
| CN | 1605790 A | 4/2005 |
| CN | 2735548 Y | 10/2005 |

* cited by examiner

*Primary Examiner* — Jason Moon Han
(74) *Attorney, Agent, or Firm* — Terry M. Sanks; Beusse Wolter Sanks & Maire, P.A.

(57) ABSTRACT

A LED lamp system including an electric linker, a heat conducting liquid, a hollow cooling system with an outer surface, a hollow chamber through which a heat conducting liquid is located, and a hollow cavity separate from the hollow chamber, at least one LED, an interface connected to the hollow cooling system and to the at least one LED, and a power supply connected between the electric linker and the interface.

17 Claims, 4 Drawing Sheets

LED LAMP SYSTEM UTILIZING A HOLLOW LIQUID-COOLED DEVICE

CROSS-REFERENCE TO RELATED APPLICATIONS

This application claims priority of Chinese Patent Application No. 200910096452.3 filed Mar. 5, 2009, which is incorporated herein by reference.

TECHNICAL FIELD

Embodiments of the present invention generally relate to light emitting diode (LED) technology and, more particularly, to cooling a LED light source.

BACKGROUND OF THE INVENTION

With the development of high-power LED technology, the performance of LEDs for lighting applications has been improved significantly. Nowadays, the luminous efficacy of LED has achieved (70-90) lumens per watt (lm/W), much higher than that of the ordinary incandescent lamps. High power LEDs, have been widely used in lighting. It has been recognized as the fourth generation of lighting sources in the 21$^{st}$ century and which will eventually replace fluorescent lamps and incandescent lamps.

However, LED has high luminous efficiency and long life only when the temperature is below 80 degrees Celsius, so there are rigid requirements in the LED heat dissipation design. Poor heat dissipation causes light decay, low efficiency and short life. In order to achieve a good effect of heat dissipation and to replace the existing standard commercial lamps, U.S. Pat. No. 6,982,518 (Chinese Patent No. 1605790A, hereinafter "the '518 patent") proposed a new LED lighting device.

The lighting device in the '518 patent includes a power supply converter, an optical engine utilizing a substrate with high heat conductivity, several LED semiconductor devices mechanically connected to the substrate, a peripheral bank fixed in the substrate and surrounding at least one part of the LED device, and a transparent polymer sealant set on the LED devices and confined by the periphery bank.

The heat dissipation system of the lighting device in the '518 patent uses solid materials (e.g. aluminum alloy, brass copper alloy, magnesium alloy, carbon polymer, carbon compounds of various metals and/or ceramic) with certain high thermal conductivity and stiffness to dissipate the heat from the LEDs and other devices. The structure of the heat dissipation system is finlike in order to dissipate a mass of heat by increasing the surface area of the heat dissipation. However, such a heat dissipation system has many drawbacks including heavy weight, excessive consumption of metal, complicated manufacturing process and high cost.

To solve the problems mentioned above, Chinese Patent No. 2735548 presented a heat dissipation structure for a high power LED, which comprises a shell base, a heat dissipation box, a circuit board and at least one high power LED. The heat dissipation box is sealed, containing some liquid for heat dissipation purpose. Due to the sound heat-conductivity of the liquid (with much lower thermal resistance than solid metals) in the sealed box, the thermal resistance between the heating elements and the cooling surface is reduced, which means that better effect can be achieved by using smaller heat dissipation surface area. However, the liquid for heat dissipation takes up considerable internal space, it adds not only the weight of the product but also the difficulty of installation, and the makes the product less safe.

SUMMARY OF THE INVENTION

The present invention intends to solve the drawbacks of the prior art by providing a preferably thermally conductive/dissipating combination assembly of a LED and a hollow-type liquid-cooled device. A LED lamp system is disclosed comprising an electric linker, a heat conducting liquid, a hollow cooling system with an outer surface, a hollow chamber through which a heat conducting liquid is located, and a hollow cavity separate from the hollow chamber, at least one LED, an interface connected to the hollow cooling system and to the at least one LED, and a power supply connected between the electric linker and the interface.

BRIEF DESCRIPTION OF THE DRAWINGS

The following are descriptions of exemplary embodiments of the present invention, but there should be more embodiments with various modifications to be covered by this invention.

DETAILED DESCRIPTION

Figure 1:
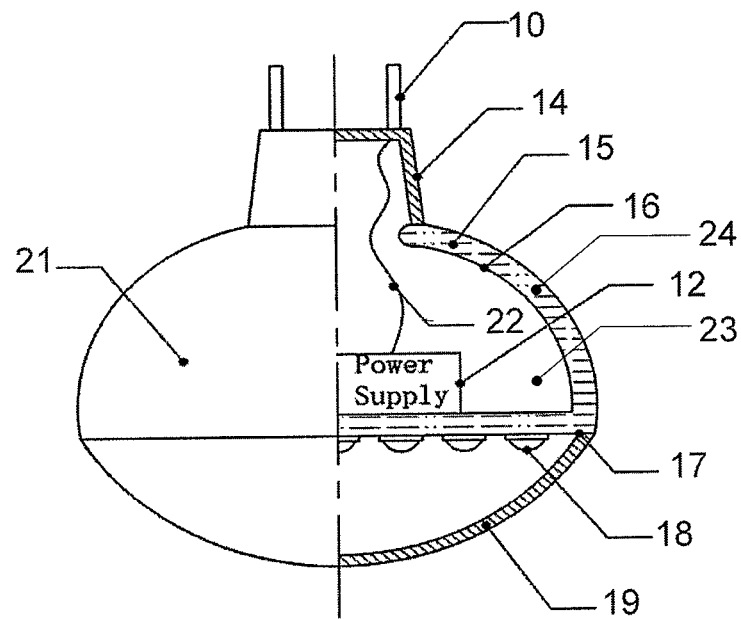
FIG. 1 illustrates an embodiment of a LED lamp utilizing hollow liquid-cooled device.

FIG. 1 illustrates an embodiment of a LED lamp utilizing hollow liquid-cooled device. The LED lamp includes a plug-in electric linker 10, a LED power supply 12, a lamp holder 14, heat conducting, or dissipating, liquid 15, a hollow cooling system 16 with an outer covering 21, a metal core printed circuit board ("MCPCB") 17, at least one LED 18 (as illustrated more than one LED may be utilized), a lampshade 19 and a power wire 22. The plug-in electric linker 10 is connected to the input of the LED power supply 12, which is located on a lower part of the LED lamp. The hollow cooling system includes a hollow chamber 23 which holds the heat conducting liquid 15. The LED power supply 12 is set in a cavity 24, also defined by and is part of the hollow cooling system 16. At least one LED 18 is fixed onto the MCPCB 17. The peripheral areas of the MCPCB 17 are closely connected with a lower part of the hollow cooling system 16. The at least one LED 18 is located inside the lampshade 19 which connects with the hollow cooling system 16. The metal core printed circuit board ("MCPCB") may be simply considered an interface board, or simply an interface, used to connect power to the at least one LED 18. Though the interface 17 is illustrated as securing the at least one LED 18, the board may simply be used to provide power to the at least one LED 18 wherein the at least one LED 18 may be secured to another attachment in other embodiments.

Though the plug-in electric linker 10 is illustrated as a male plug configured to fit within a female receptacle, those skilled in the art readily recognize that the electric linker 10 is a plug-type connector wherein it may posses a plurality of configurations, including but not limited to being spiral.

The hollow cooling system 16 and the MCPCB 17 constitute a closed body, meaning that the hollow cooling system is connected air-tightly with the interface. The hollow chamber 24, that is a part of the hollow cooling system 16, is filled with the high-performance heat conducting liquid 15. As illustrated the hollow chamber 24 is near an edge of the hollow cooling system 16. The hollow chamber 24 may simply be provided along the walls of the hollow cooling system 16 or also at the area where the MCPCB 17 is located. Thus, the hollow chamber 24 of the hollow cooling system 16 extends around an outer edge of the hollow cooling system 16 with the hollow cavity 23 being within the hollow chamber 24.

A top of the hollow cooling system 16 has an opening shape, connecting with the bottom of the lamp holder through a sealing gasket. The hollow cooling system 16 may be made from light-weight environment-friendly material like plastic, glass etc. In different embodiments, the hollow cooling system 16 can be formed into any shape, from the uninterrupted, almost "smooth" surface to any place of a discontinuous surface (e.g., finlike objects). Besides, in different applications and embodiments discussed in further detail below, the hollow cooling system 16 could be in a shape similar to that of a standard commercial lamp. Therefore, it should be understood that the hollow cooling system 16 can have any shape or structures, which fall within the range of the inventors' claims to be protected. For example, in different embodiments of the present invention, the hollow cooling system 16 can be made into various shapes and sizes to facilitate the heat dissipation, such as increasing the area of the hollow cooling system 16.

As discussed above, the heat conducting liquid 15 may possess such features as, but not limited to high conductivity, strong liquidity, stability and slow volatility to dissipate heat from other components of the LED lighting fixture. Water, heat conducting oil, salt water, Glycol solution, Bismethane saturated solution, etc. are examples of elements that may be part of the heat conducting liquid 15. When choosing the heat conducting liquid 15, any number of the following factors must be taken into account: thermal conductivity, freezing point, viscosity, boiling point, decomposition temperature, corrosivity, flammability, toxicity and/or cost. The heat conducting liquid can be conductive or non-conductive.

The at least one LED 18 connects closely with the MCPCB 17 through a thermal insulation film and thermal insulation adhesive tape. The peripheral areas of the MCPCB 17 are closely connected with the lower part of the hollow cooling system 16. The upper surface of the MCPCB 17 is in contact with the heat conducting liquid 15 through which the heat dissipated by the at least one LED 18 is diffused, by conduction and/or convection.

The MCPCB 17 is located within the lampshade 19, which either is in a shape of a hollow hemisphere or another shape with an opening at one end. The lampshade 19 connects with the hollow cooling system 16. The size of the lampshade 19 should adapt to the size of the hollow cooling system 16 and the size of the LED light lamp holder. The lampshade 19 may be made of transparent material such as glass or polymethyl methacrylate ("PMMA"), and the surface may be treated with sandblast, powderblast, etc. to achieve different light effect. The surface curvature of the lampshade 19 could also be adjusted to achieve the demand of different lighting area and light intensity.

The LED power supply 12 is set in the hollow chamber 24 of the hollow cooling system 16. The at least one LED 18 is powered by the LED power supply 12 through the power wire 22. The LED power supply 12 may be a switching power supply which may connect to a commercial power source. When the heat conducting liquid 15 is non-conductive, the LED power supply 12 can be a non-isolated power supply.

Figure 2:
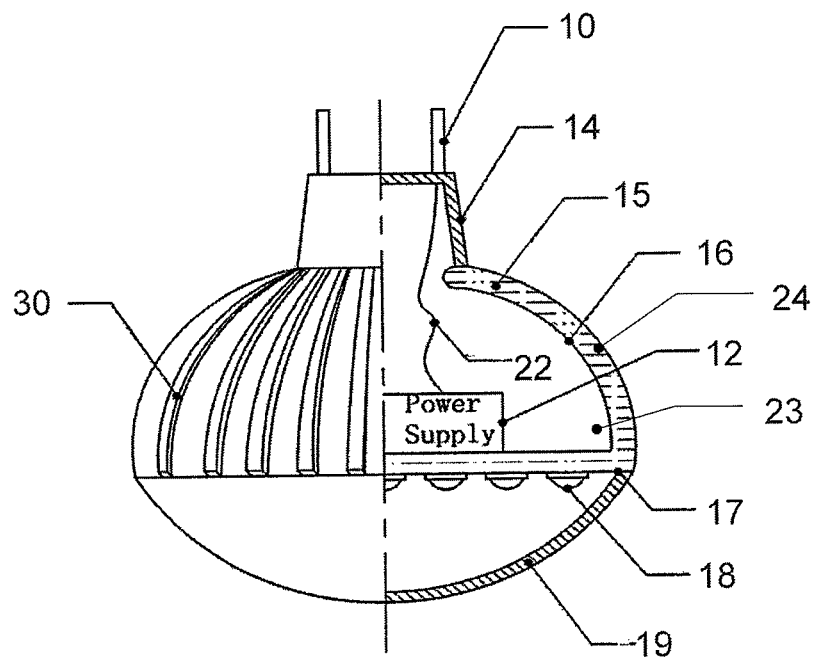
FIG. 2 illustrates a second embodiment of a LED lamp utilizing hollow liquid-cooled device.

As shown in FIG. 2, a second embodiment of a LED lamp utilizing hollow liquid-cooled device is illustrated. The LED lamp includes the plug-in electric linker 10, the LED power supply 12, the lamp holder 14, the heat conducting liquid 15, the hollow cooling system 16, the MCPCB 17, the at least one LED 18, the lampshade 19 and the power wire 22. As discussed above, an outer surface 21, or covering, of the hollow cooling system 16 may be constructed into some finlike object 30, or configuration. The hollow chamber 24 which holds the heat conducting liquid 5 is configured to pass into the finlike objects 30 to increase the surface area of the hollow cooling system 16, hence a greater mass of heat can be dissipated. The outer edge of the LED lamp with such finlike objects 30 is similar to a cross-section of a standard commercial lamp, and the sequential outline is basically similar to that of the standard commercial lamp. The remaining components of the LED lamp utilizing the hollow liquid-cooled device are the same as those shown in the aforesaid embodiment in FIG. 1.

Figure 3:
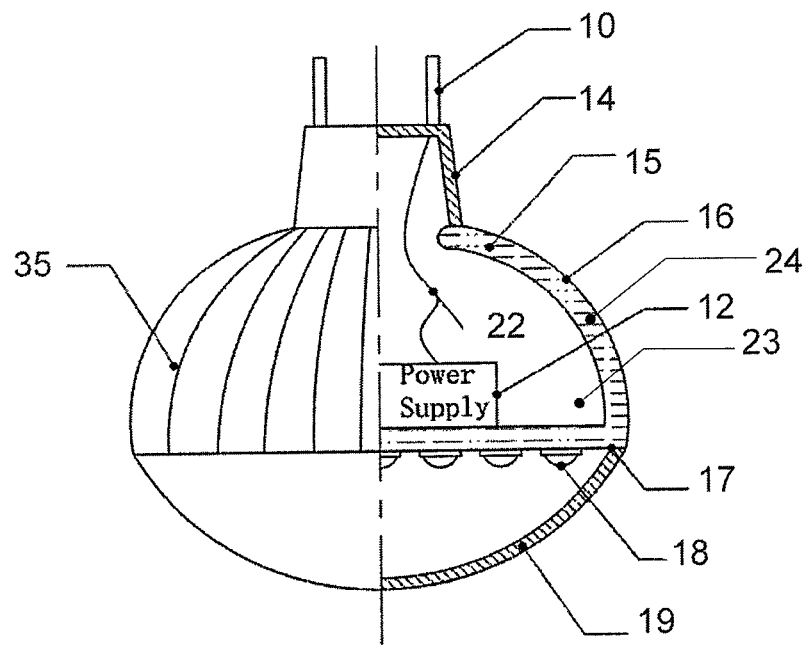
FIG. 3 illustrates a third embodiment of a LED lamp utilizing hollow liquid-cooled device.

As shown in FIG. 3, a third embodiment of a LED lamp utilizing hollow liquid-cooled device is illustrated. The LED lamp includes the plug-in electric linker 10, the LED power supply 12, the lamp holder 14, the heat conducting liquid 15, the hollow cooling system 16, the MCPCB 17, the at least one LED 18, the lampshade 19 and the power wire 22. The outer surface 21 of the hollow cooling system 16 can be constructed into a heat sink 35 to increase the surface area of the hollow cooling system 16, hence a greater mass of heat can be dissipated. The outer edge of LED lamp with the heat sink 35 is similar to a cross-section of a standard commercial lamp, and the sequential outline is basically similar to that of a standard commercial lamp. The remaining components of LED lamp utilizing hollow liquid-cooled device are the same as those of the aforesaid embodiment in FIG. 1.

The finlike objects 30 or the heat sink 35 may be considered extrusions and/or resulting in an intermittent surface. The extrusions may rise above the surface and/or may beneath the surface. The hollow chamber 24 may extend into the part of the outer surface that has an intermittent surface, or into and/or against the part of the surface that is an extrusion.

Figure 4:
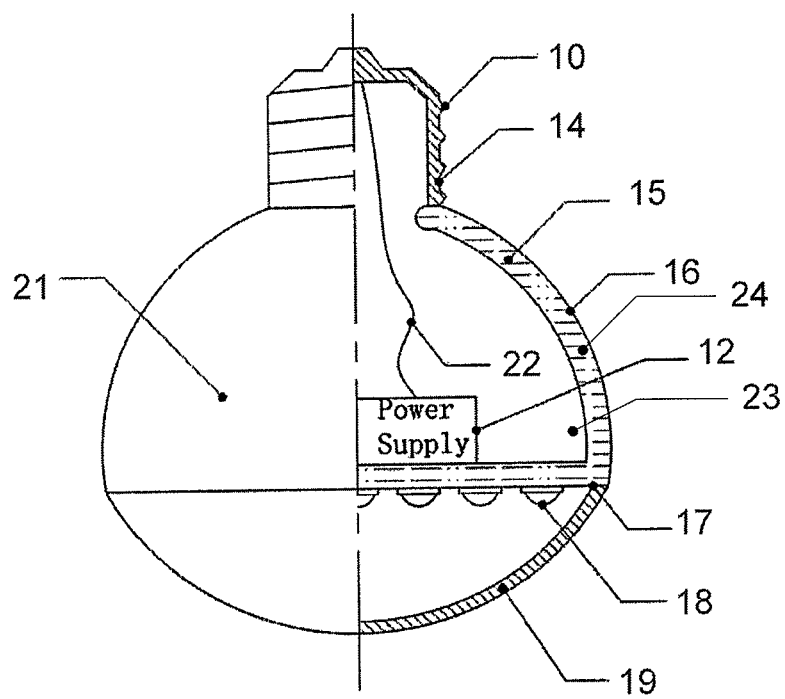
FIG. 4 illustrates a fourth embodiment of a LED lamp utilizing hollow liquid-cooled device.

As shown in FIG. 4, a fourth embodiment of a LED lamp utilizing hollow liquid-cooled device is illustrated. The LED lamp includes a spiral electric linker 10, the LED power supply 12, the lamp holder 14, the heat conducting liquid 15, the hollow cooling system 16, the MCPCB 17, the at least one LED 18, the lampshade 19 and the power wire 22. Other than illustrating the electric linker having a spiral connector, the remaining components of LED lamp utilizing hollow liquid-cooled device are the same as those of the aforesaid embodiment in FIG. 1.

Figure 5:
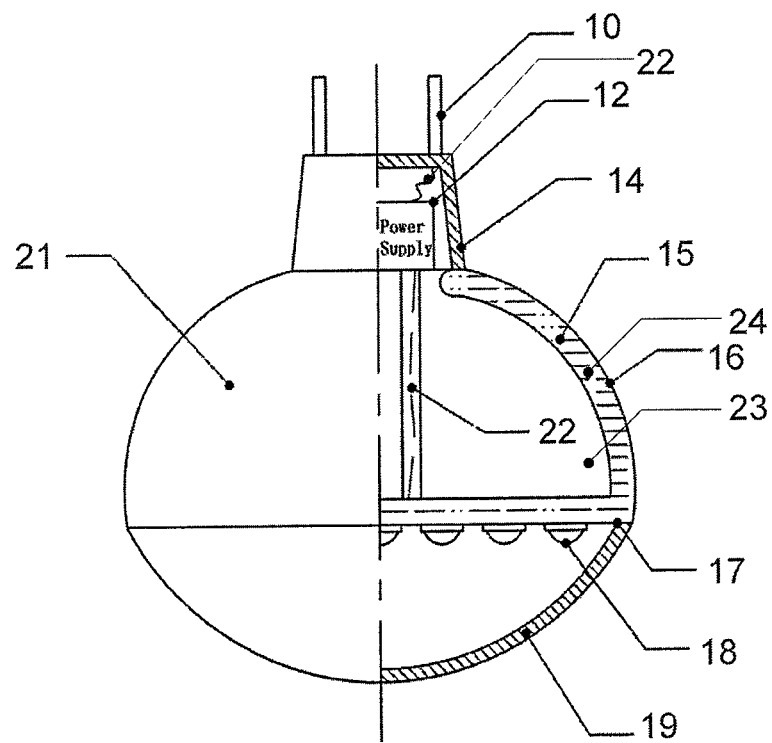
FIG. 5 illustrates a fifth embodiment of a LED lamp utilizing hollow liquid-cooled device.

As shown in FIG. 5, a fifth embodiment of a LED lamp utilizing hollow liquid-cooled device is illustrated. The LED lamp includes the plug-in electric linker 10, the LED power supply 12, the lamp holder 14, the heat conducting liquid 15, the hollow cooling system 16, the MCPCB 17, the at least one LED 18, the lampshade 19 and the power wire 22. The LED power supply 12 is located in an upper part of the hollow cooling system 16 and the space formed by the lamp holder 14. In this configuration, the heat generated by the at least one LED 18 and the LED power supply 12 may be more effectively diffused through conduction and convection. The remaining components of LED lamp utilizing hollow liquid-cooled device are the same as those in the aforesaid embodiment in FIG. 1.

Figure 6:
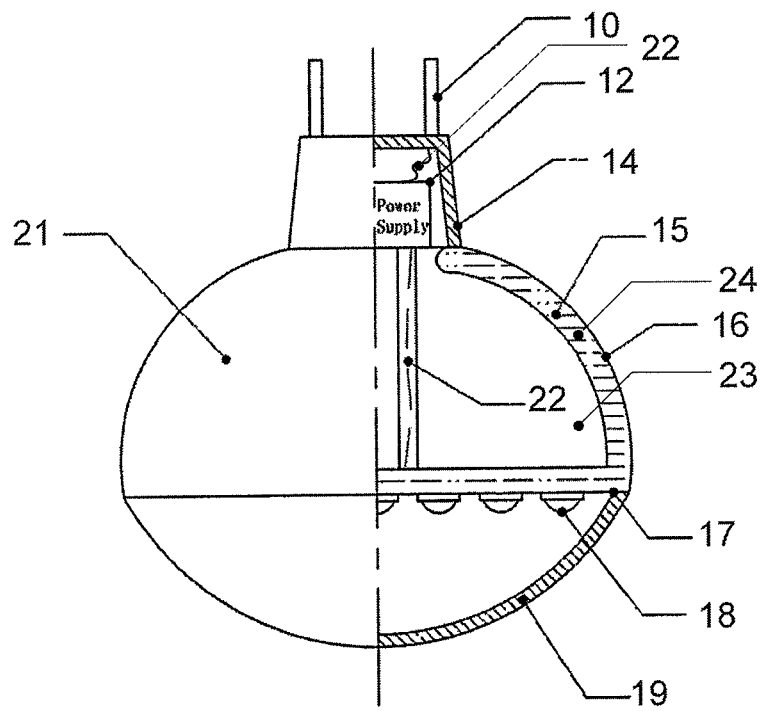
FIG. 6 illustrates a sixth embodiment of a LED lamp utilizing hollow liquid-cooled device.

As shown in FIG. 6, a sixth embodiment of a LED lamp utilizing hollow liquid-cooled device is illustrated. The LED lamp includes the plug-in electric linker 10, the LED power supply 12, the lamp holder 14, the heat conducting liquid 15, the hollow cooling system 16, the MCPCB 17, the at least one LED 18, the lampshade 19 and the power wire 22. The at least one LED 18 is fixed onto the MCPCB 17, and in the heat conducting liquid of hollow cooling system 16. The thermal resistance between the LED lamp and the heat conducting liquid is reduced, so it helps the heat to dissipate. The LED power supply 12 is put in the cavity of the hollow cooling system 16, connecting with the plug-in electric linker 10 through power wire 22. The remaining components of LED lamp utilizing hollow liquid-cooled device are the same as those in the aforesaid embodiment in FIG. 1.

Figure 7:
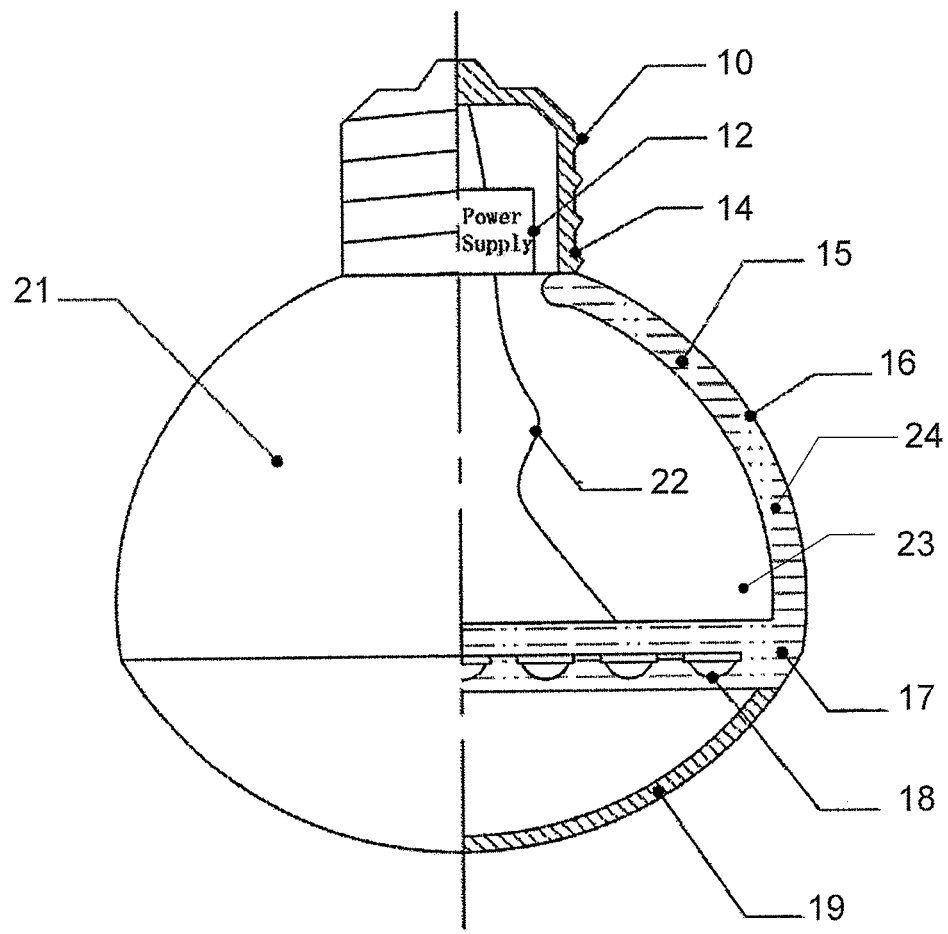
FIG. 7 illustrates a seventh embodiment of a LED lamp utilizing hollow liquid-cooled device.

As shown in FIG. 7, a seventh embodiment of a LED lamp utilizing hollow liquid-cooled device is illustrated. The LED lamp includes the plug-in electric linker 10, the LED power supply 12, the lamp holder 14, the heat conducting liquid 15, the hollow cooling system 16, the MCPCB 17, the at least one LED 18, the lampshade 19 and the power wire 22. The at least one LED 18 is fixed on the MCPCB 17, and in the heat conducting liquid of hollow cooling system 16. In this way, the thermal resistance between the LED lamp and the heat conducting liquid 15 is reduced, so it helps to diffuse the heat better. The LED power supply 12 is set in the upper part of the hollow cooling system 16 and the space formed by the lamp holder. The heat dissipated by the at least one LED 18 and the LED power supply 12 may be better diffused through conduction and convection. The remaining components of LED lamp utilizing hollow liquid-cooled device are the same as those of the aforesaid embodiment in FIG. 1.

There are a lot of choices for the shape of the electric linker, the hollow cooling system, the lampshade, and the lamp holder of the LED lamp in the present invention according to different applications requirements. Various changes of the forms and details should be regarded as the inventors' claims to be protected.

Exemplary embodiment of the present invention can be used in indoor or outdoor LED lighting applications at all power-levels, i.e. low-power LED lighting applications, such as but not limited to indoor lamps, and high-power LED lighting applications, such as but not limited to outdoor LED streetlights. Environment-friendly and durable, as well as clean and smart, the LED lamp gives a feeling of comfort and beauty. It has the characteristics of compact structure, rational layout, a preferred thermal performance, low cost and light weight. Its outlook is delicate, and it is energy-efficient, environment-friendly, with a liquid cooling system. It adopts light-weight materials like plastic and glass.

Last but not the least, exemplary embodiments of the present invention are demonstrated by, but not limited to, the detailed embodiments described above and could has various modifications. While the preferred embodiments has been described by way of example, it will be apparent to those skilled in the art that various modification may be made in the embodiments should be regarded as the inventors' claims to be protected. Therefore, it will be understood that examples are just the illumination of the present invention, but not limited to the invention. All extended solution or substitution based on the principle and content of this invention should be regarded as the inventors' claims to be protected.

What is claimed is:

1. A LED lamp system comprising:
   an electric linker for a lamp socket;
   a heat conducting liquid;
   a hollow cooling system with an outer surface, a hollow cavity, and a hollow chamber through which the heat conducting liquid is located with a majority of the hollow chamber in contact with the outer surface, wherein the hollow chamber defines an outer periphery of the lamp system that surrounds the hollow cavity;
   at least one LED being outside of the hollow cooling system;
   an interface connected to the hollow cooling system and to the at least one LED; and
   a power supply connected between the electric linker and the interface.

2. The LED lamp system according to claim 1, further comprising a lampshade connected to cover the at least one LED.

3. The LED lamp system according to claim 2, wherein the lampshade comprises glass and/or polymethyl methacrylate.

4. The LED lamp system according to claim 1, wherein the hollow cooling system is connected air-tightly with the interface.

5. The LED lamp system according to claim 1, wherein the heat conducting liquid is conductive and/or non-conductive.

6. The LED lamp system according to claim 1, wherein the heat conducting liquid is comprised of water, heat conducting oil, salt water, Glycol solution and/or a Bismethane saturated solution.

7. The LED lamp system according to claim 1, wherein the hollow cooling system comprises light-weight materials such as plastic, glass and/or metal.

8. The LED lamp system according to claim 1, wherein the outer surface of the hollow cooling system comprises extrusions that rise and/or are lower than the outer surface.

9. The LED lamp system according to claim 8, wherein the hollow chamber extends into the extrusions.

10. The LED lamp system according to claim 1, wherein the outer surface of the hollow cooling system comprises an intermittent surface.

11. The LED lamp system according to claim 10, wherein the hollow chamber extends into the part of the outer surface that has the intermittent surface.

12. A hollow liquid-cooled device for use with a LED light system including a lamp socket, the device comprising:
   a heat conducting liquid; and
   a hollow cooling system, forming a part of a body of the LED light system, with an outer surface, a hollow cavity, and a hollow chamber through which the heat conducting liquid is located with a majority of the hollow chamber in contact with the outer surface, wherein the hollow chamber defines an outer periphery of the light system that surrounds the hollow cavity.

13. The hollow liquid-cooled device according to claim 12, further comprising an interface to connect at least one LED to power wherein the hollow cooling system is connected air-tightly with the interface.

14. The hollow liquid-cooled device according to claim 12, wherein the outer surface of the hollow cooling system comprises extrusions that rise and/or are lower than the outer surface.

15. The hollow liquid-cooled device according to claim 12, wherein the hollow chamber extends into the extrusions.

16. The hollow liquid-cooled device according to claim 12, wherein the outer surface of the hollow cooling system comprises an intermittent surface.

17. The hollow liquid-cooled device according to claim 12, wherein the hollow chamber extends into the part of the outer surface that has an intermittent surface.

* * * * *